US012558704B2

(12) United States Patent (10) Patent No.: US 12,558,704 B2
Vieluf (45) Date of Patent: Feb. 24, 2026

(54) DEVICE AND METHOD FOR COATING PARTICLES

(71) Applicant: POMODOI GMBH, Radeber (DE)

(72) Inventor: Maik Vieluf, Moritzburg (DE)

(73) Assignee: POMODOI GMBH, Radeber (DE)

( * ) Notice: Subject to any disclaimer, the term of this patent is extended or adjusted under 35 U.S.C. 154(b) by 121 days.

(21) Appl. No.: 18/179,844

(22) Filed: Mar. 7, 2023

(65) Prior Publication Data

US 2023/0286014 A1 Sep. 14, 2023

(30) Foreign Application Priority Data

Mar. 8, 2022 (DE) ..................... 10 2022 105 410.1

(51) Int. Cl.
B05C 13/02 (2006.01)
B05C 5/00 (2006.01)
B05D 1/00 (2006.01)
C23C 14/00 (2006.01)

(52) U.S. Cl.
CPC .............. B05C 13/02 (2013.01); B05C 5/002 (2013.01); B05D 1/002 (2013.01); C23C 14/00 (2013.01); *B05D 2258/00* (2013.01)

(58) Field of Classification Search
CPC ... C23C 14/00; C23C 14/0021; C23C 14/221; C23C 14/223; C23C 14/34; C23C 14/3435; C23C 14/3442; C23C 14/46; C23C 14/50; C23C 14/505; C23C 14/54; C23C 14/56; B05C 5/002; B05C 13/02; B05D 1/002;

(Continued)

(56) References Cited

U.S. PATENT DOCUMENTS 2,737,461 A * 3/1956 Heisler .................. B05D 7/227
427/195
4,430,003 A * 2/1984 Beattie .................... B01F 25/74
366/175.3
4,940,523 A 7/1990 Takeshima
(Continued)

FOREIGN PATENT DOCUMENTS

DE 1295956 B 8/1965
DE 112012000580 T5 11/2013
(Continued)

*Primary Examiner* — Gordon Baldwin
*Assistant Examiner* — Joshua Reyes
(74) *Attorney, Agent, or Firm* — HESLIN ROTHENBERG FARLEY & MESITI P.C.

(57) ABSTRACT

The invention relates to a coating arrangement for coating particles, a method for coating particles, and corresponding uses. The coating arrangement includes a coating chamber and a coating device arranged in the coating chamber. This device comprises a hollow body with an axis, the inner wall of which forms a particle track around the axis of the hollow body, a particle source and a particle sink, and at least one coating source. The coating source is adapted for emitting a coating material along a direction perpendicular to the axis of the hollow body. Furthermore, the coating device comprises a rotation device which is adapted for rotating the hollow body about its axis, and a cleaning device which is arranged in the interior of the hollow body in a stationary manner with respect to the hollow body and is adapted for removing adhering coating material from the inner wall of the hollow body.

16 Claims, 6 Drawing Sheets

(58) Field of Classification Search
CPC ............... B05D 2258/00; H01J 37/3233; H01J
37/32431; H01J 37/32458
See application file for complete search history.

(56) References Cited

U.S. PATENT DOCUMENTS

| | | | | | |
|---|---|---|---|---|---|
| 5,470,388 | A | * | 11/1995 | Goedicke ................. | C23C 14/22 |
| | | | | | 118/716 |
| 5,656,325 | A | * | 8/1997 | Wallace ................... | B05C 19/06 |
| | | | | | 427/195 |
| 6,197,368 | B1 | * | 3/2001 | Valenti .................... | B05C 19/06 |
| | | | | | 118/308 |
| 6,220,203 | B1 | * | 4/2001 | Burger .................... | C23C 14/22 |
| | | | | | 118/728 |
| 6,241,858 | B1 | * | 6/2001 | Phillips ................... | C23C 14/50 |
| | | | | | 428/404 |
| 2003/0077446 | A1 | * | 4/2003 | Yeh ...................... | C09B 67/0004 |
| | | | | | 428/401 |

FOREIGN PATENT DOCUMENTS

| | | | |
|---|---|---|---|
| DE | 102019134531 | A1 | 6/2021 |
| EP | 0855452 | A1 | 7/1998 |
| WO | 2006/083725 | A2 | 8/2006 |

* cited by examiner

DEVICE AND METHOD FOR COATING PARTICLES

CROSS-REFERENCE TO RELATED APPLICATIONS

This application claims priority to German Patent Application No. 10 2022 105 410.1, filed on Mar. 8, 2022, the entire contents of which are hereby incorporated by reference herein.

FIELD OF THE INVENTION

The invention relates to a device and a method for coating particles, in particular particles of a powder medium, wherein a parasitic coating of the device is reduced.

BACKGROUND OF THE INVENTION

Powder materials are used in many technological fields, for example in powder metallurgy, in the chemical, semiconductor, paint, cosmetics and textile industry, in medicine and in fuel or battery cells. In order for the particles of these materials to develop their properties as individual particles during their use, that is to say for example during processing or also in long-term operation of a battery cell, in that they obtain certain functions in a targeted manner and do not interact, for example, with one another to form superstructures or interact with one another, and thus change their properties, the particles are often coated. In addition to wet-chemical methods for coating, various dry coating methods are used. A further distinction is made between thick and thin film coating. In case of thin-film coating, CVD (chemical vapor deposition), ALD (atomic layer deposition) and PVD (physical vapor deposition) methods are used, for example. Disadvantages of the ALD process are the low coating rates and the limited selection of coating materials or the difficult and cost-intensive provision thereof. In addition, the layers produced are often contaminated by embedded hydrocarbons, coalesce in particular due to the frequently occurring islet growth (Volmer-Weber growth) in the initial stage to form inhomogeneous layers or locally varying layer thickness distributions and sometimes also have defects. The area of the coating system required for this purpose varies depending on the nominal target layer thickness.

The particles to be coated can be provided in various ways. The particles to be coated can be present in a kind of fluid bed at the bottom of a container in which they are kept in motion by a movement of the container, for example a slow rotation of the container or a vibration of the container, or another external force, which is provided, for example, by a stirrer or piezoelectric actuators. Such devices are described, for example, in U.S. Pat. No. 4,940,523 A and WO 2006083725 A2. However, the uniform all-sided coating of the particles is difficult to implement. In addition, in powder media with correspondingly wide particle size distributions, a very non-specific layer thickness control, or layer thickness accumulation, occurs, in particular when comparing particles with sizes of a few micrometers up to sizes of a few 10 or 100 micrometers. In this case, the layer thicknesses within a process batch can differ from one another by several factors. Furthermore, interactions of the particles with one another, for example by friction, occur during the coating. For this reason, methods are used, among other things, with which the particles to be coated are transferred into a vortex flow, with which the particles are substantially separated and passed through a cloud of coating material. Such a method is described, for example, in DE 11201200580 T5.

In other methods, the particles are fed individually into a coating chamber. For example, the coating device of DE 102019134531 A1 comprises a hollow, rotationally symmetrical chamber with an inner wall, a coating source and a particle feed. The axis of the chamber is oriented vertically, i.e. in the direction of gravity. The particle feed guides the particles to be coated into the interior of the chamber, wherein it accelerates the particles in such a way that they move along the inner wall of the chamber on a path surrounding the axis of rotation of the chamber and are pressed against the inner wall of the chamber. When the particles enter the chamber, these are deflected rotationally symmetrically, which leads to a conversion of the previously horizontal speed of the particles into a substantially vertical speed. In the chamber itself, the particles are accelerated substantially by the gravitational force and move mainly in a direction along the axis of the chamber. The coating source emits a coating material, for example as a vapor cloud, into the interior of the chamber substantially along the direction of the axis of the chamber, wherein the coating material comes into contact with the chamber inner wall.

A disadvantage of this solution is that the coating material introduced into the chamber is only used to a very limited extent for the coating of the particles, since, in particular in the case of the very expensive electron beam-induced evaporation, the region of the highest vapor rate extends in the center of the chamber, i.e. along the chamber axis, while the particles to be coated move only on the inner wall of the chamber. Furthermore, the movement path of the particles to be coated between the inlet of the particles into the chamber and the outlet of the particles from the chamber is relatively short, so that only a small process window for the adjustment, for example, of the layer thickness results. Due to the particles traveling only once along the movement path, the achievable layer thickness is also limited and only one coating material can be deposited. Furthermore, particles with a size in the sub-micrometer range or in the single-digit micrometer range can only be coated very thinly. Another very significant disadvantage is the parasitic coating of the chamber wall which occurs during the coating, i.e. the unwanted material-specific coverage of the interior, along which the particles move. On the one hand, the process life is greatly limited as a result, because the particles can be strongly deflected or scattered from their dedicated trajectory by morphological or topographical defects, and on the other hand, the powder medium, i.e. the particles to be coated or already coated, is contaminated by falling layer filaments or broken chunks. The parasitic coating of the chamber interior wall allows only for short service lives and requires a high maintenance effort of the coating device. As a result of the design of the chamber and the arrangement of the coating source therein, a direct view of the coating source is also not possible, which makes process management and further long-term stability more difficult. The pump regime or pump stand is designed inefficiently due to the necessary shadowing from the evaporation space, i.e. from the interior of the chamber.

DE 12 95 956 A describes a coating device which contains a rotating, cone-shaped hollow body and a coating source (thermal evaporator or rod, with which material is evaporated by means of an electron beam). The particles to be coated move on the inner wall of the hollow body from an inlet point at the lower end of the hollow body due to the centrifugal forces of rotation up to an outlet point at the upper end of the hollow body, where they fall into a channel and are discharged from there or fed again to the inlet point.

EP 0-855-452 A1 discloses a plasma processing apparatus for titanium coating of semiconductor substrates. The processing apparatus contains a chamber with a wafer support and a gas supply (showerhead). After the reaction at the wafer surface, the process gas is discharged through a pump channel by means of a vacuum pump. Various solutions for cleaning the chamber wall of undesired coatings are described. Thus, the chamber can be cleaned in its entirety by means of a dry cleaning process, i.e. the feeding of a corresponding etching gas or the generation of a cleaning plasma with correspondingly high-energy plasma particles. In other variants, the chamber is opened and at least parts thereof are wet-cleaned.

The object is therefore to provide a coating system and a method for coating particles, which reduces the disadvantages of the prior art.

BRIEF SUMMARY OF THE INVENTION

According to the invention, the object is achieved by a coating device and a method for coating particles according to the independent claims. Advantageous embodiments of the invention are specified in the dependent claims.

DETAILED DESCRIPTION OF THE INVENTION

Figure 1:
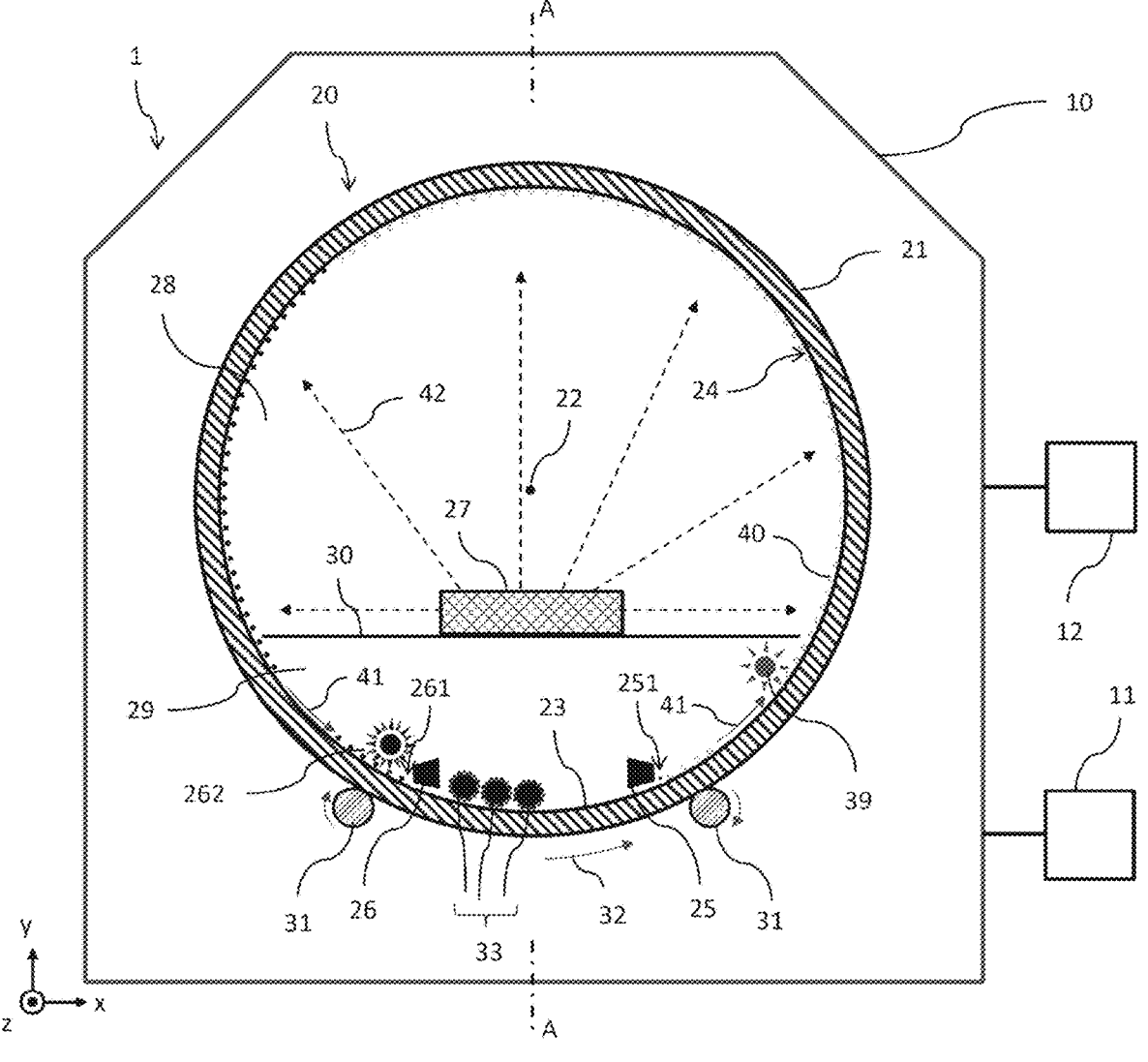
FIG. 1 shows a schematic representation of a coating arrangement in cross section transversely to the axis of the hollow body.

A first aspect of the invention relates to a coating arrangement for coating particles. The coating arrangement includes a coating chamber and a coating device arranged in the coating chamber. The coating chamber is designed such that it can be evacuated or provided with a defined atmosphere, such as an inert gas. Thus, the chamber is closed against the surrounding atmosphere and connected to a pump system and a gas feed system, which is adapted for ventilating the coating chamber.

The coating device comprises a hollow body with a (virtual) axis, a particle source, a particle sink, at least one coating source, a rotation device and a cleaning device.

The hollow body has an inner wall which forms a smooth particle track around the axis of the hollow body between a particle inlet point and a particle outlet point. That is, the particle track is described by a curve the first derivative of which is continuous. In other words, the inner wall of the hollow body, which forms the particle track, has no corners or edges, but can be structured or profiled. The inner wall of the hollow body can thus have, in particular, a circular shape or an elliptical shape in cross section transverse to the axis of the hollow body. However, other shapes of the hollow body are also possible as long as the region of the inner wall of the hollow body, which forms the particle track, meets the above mentioned condition. The basic shape of the hollow body along its axis can have different forms. It can be a straight circular cylinder with which the ratio between diameter and length can be arbitrary, but is adapted to the coating process. Both very narrow rings and long hollow cylinders are thus possible embodiments. In other embodiments, however, the hollow body can also have a conical shape, i.e. the diameter of the hollow body decreases along the axis. In some embodiments, the hollow body can be closed on one side with respect to its extension along the axis, i.e., for example, it can be a circular cylinder or cone closed on one side or a hemisphere or can have a bell shape or a cup shape along the axis. The hollow body can also be formed by a deformable material which can also assume any forms outside the particle track. Such a deformable material is, for example, an endless belt made of rubber or a metal or plastic film, wherein the shape of the material is defined in different regions in each case by corresponding guide devices.

The particle track is preferably a partial region of the inner wall of the hollow body, wherein the partial region can refer to the circumference of the inner wall in cross section transversely to the axis and/or to the extent of the inner wall along the axis. The particle track can thus be formed by a circular segment, a complete circle or a spiral, wherein a complete circle can also be run through several times. Furthermore, a connection of straight portions with curved portions of the particle track is also possible as long as the resulting particle track meets the above mentioned conditions. The particle track is the movement path on which a particle to be coated moves between a particle inlet point and a particle outlet point in the hollow body and along the inner wall of the hollow body.

Further components of the coating arrangement can be arranged in the interior of the hollow body, so that only a part of the interior of the hollow body can be available as a gas space. These further components can also comprise the axis of the hollow body. The gas space is understood as the region of space within the hollow body that is not occupied by components of the coating device. The gas space can be provided as a self-contained spatial region or also as a plurality of spatially separated spatial regions.

The particle source is adapted for introducing the particles into the hollow body at the particle inlet point, so that the particles move on the particle track. Various devices known from the prior art can be used as the particle source. In embodiments, the particle source is adapted for providing the particles with a movement impulse, so that the particles to be coated move on the particle track up to the particle outlet point relative to the hollow body. The maximum velocity of the particles on the particle track can be, for example, in the range of 1 m/s to 20 m/s or up to 30 m/s. It is also possible to provide the particles with a movement impulse at a later time when they are already moving on the particle track. The particle sink is adapted for receiving the particles at the particle outlet point after passing through the particle track and to extract them from the hollow body. In particular, the particle sink can be designed such that the removal of the particles takes place completely passively, or the particle sink can contain special devices which support particle removal from the inner wall of the hollow body.

Each of the at least one coating source is arranged within the hollow body and is adapted for emitting a coating material along a direction, which runs perpendicular to the axis of the hollow body in such a way that the coating material comes into contact with the inner wall of the hollow body in a coating region which contains at least part of the particle track. Perpendicular to the axis of the hollow body also comprises a deviation from the vertical of ±10°. The coating source is thus pointed directly onto the inner wall of the hollow body and emits the coating material substantially in a radial plane with respect to the axis of the hollow body and not along the same. Of course, it is clear to the person skilled in the art that the coating material emerging from the coating source propagates within the hollow body, i.e. in the gas space of the hollow body, in a material cloud, wherein particles of the coating material also deviate from the radial plane. However, the coating source is arranged such that the main movement direction of the emitted coating material runs perpendicular to the axis of the hollow body. The at least one coating source can be formed as a point or line source, a rotating or otherwise moving source, and can be any type of particle source. Preferably, at least one of the at least one coating source is a PVD source, for example a thermal evaporation source, an electron beam or laser beam vaporization source, with which the coating material is evaporated, semi-sublimed or sublimed, or a sputtering target. The coating material can be a wide variety of materials, for example metals, alloys, semiconductors, metal oxides, carbides, nitrides, cermets, sulfides, selenides, tellurides and others. In the present application, however, the term "coating material" is also intended to mean reactants for a chemical reaction, the product or products of which are then meant to be the actual material with which the particles are coated. The reactants emitted by the at least one coating source can react with one another or with a gas or gas component present in the atmosphere in the coating chamber.

The coating region of the coating arrangement is the region of the hollow body, in which the emitted coating material is present in the gas space during operation of the coating arrangement and comes into contact with the inner wall of the hollow body and the particles to be coated. This can be the entire gas space of the hollow body or only a part thereof. The coating region can also be referred to as a process region, process window or coating window.

The other region or regions of the interior of the hollow body, which are not a coating region and adjoin the inner wall of the hollow body, are referred to as non-coating region(s). In the non-coating region, substantially no coating material is thus applied to the particles to be coated and to the inner wall of the hollow body during operation of the coating arrangement. In embodiments, for example, the particle source and the particle sink are arranged in the non-coating region.

The rotation device is adapted for rotating the hollow body about its axis. If the hollow body or a partial region thereof is realized by an endless belt, the rotation of the hollow body or at least of the partial region thereof is realized by a movement of the endless belt, wherein this movement then does not have to be any actual rotation about the axis of the hollow body. In embodiments, the rotation device is adapted for rotating the hollow body into the particle movement direction. The rotation device can be any device known from the prior art. The rotation can be carried out continuously or can vary with time, with rotational speeds in the range between 0 (zero) and a few thousand revolutions per minute, wherein the value 0 (zero) is used at most in a temporally limited way. Preferably, the speed at which the hollow body rotates is less than the maximum speed at which the particles move on the particle track. The rotation device preferably engages the outside of the hollow body.

The cleaning device is arranged in the interior of the hollow body stationary with respect to the hollow body and adapted for removing adhering coating material from the inner wall of the hollow body. The adhering coating material is preferably removed completely, but only partial removal is also possible. The cleaning device is arranged in the non-coating region of the hollow body outside the particle path, for example in the particle direction downstream of the particle sink. Various devices known from the prior art can be used as the cleaning device, wherein the adhering coating material is removed mechanically, for example by means of brushes, rollers, pressing wheels, sand or dry ice blasting, or by a physical or chemical etching process, such as, for example, laser ablation, ion beam etching, plasma etching or wet chemical etching. Although the cleaning device is arranged in a stationary manner with respect to the hollow body, so that during operation of the coating arrangement, it cleans a defined partial region of the circumference of the inner wall of the rotating hollow body at a defined point in time, it can also be arranged movably, for example along the axis of the hollow body, so that it cleans, for example, different partial regions of the inner wall of the hollow body along its axis at different points in time. The coating device can also contain a plurality of cleaning devices which act on the inner wall of the hollow body in succession along the circumference of the hollow body and/or with an offset to each other along the axis of the hollow body. In addition to the coating material adhering to the inner wall of the hollow body, which is also referred to as a parasitic coating, the cleaning device can also remove adhering particles from the inner wall of the hollow body. The type and size of the cleaning device and the number of cleaning devices are adapted to the type of coating material and the coating rate of the at least one coating source and the parasitic degree of coverage of the inner wall of the hollow body.

Each component of the coating arrangement according to the invention is made of a material which is suitable for the function of the respective component. Thus, for example, the coating chamber can consist of stainless steel, while the hollow body can also consist of stainless steel, for example, but also of other materials such as ceramic, copper, steel, aluminum, chromium or a deformable material such as a strip made of rubber or film, flexible glass or a layer system comprising different layers of different materials. For example, the inner wall of the hollow body, which consists, for example, of stainless steel, can be provided with a layer made of carbon (diamond-like carbon, DLC; graphite-like carbon, GLC), a hard material such as titanium nitride or chromium nitrite, titanium carbide, chromium carbide, or also chromium or molybdenum, which supports the removal of the parasitic coating. The same also applies to the other components such as the particle source, the particle sink, the coating source or parts thereof or the cleaning device.

The coating arrangement according to the invention provides many advantages over the prior art. On the one hand, the particles on their particle track in the coating region are pressed onto the inner wall of the hollow cylinder by the coating material emitted by the coating source. The different speed of the particles with respect to the rotation of the hollow body causes a rotational movement of the particles that changes over time, which allows a virtually homogeneous all-sided coating of the particles on the statistical average. Furthermore, good separation of the particles can be achieved, which reduces shadowing of individual particles by other particles. As a result of the arrangement of the coating source in such a way that the coating material is primarily emitted perpendicularly to the axis of the hollow body in the direction of the inner wall of the hollow body, the particles on their particle track always pass through the region with the highest surface occupancy density of the coating material and thus the region with the highest deposition rate. Thus, larger layer thicknesses of the material deposited on the particles or a higher velocity of the particles on the particle track, which is connected with a higher throughput of particles through the coating device, are possible. Another important advantage of the coating arrangement is the possibility of continuous removal of the parasitic coating from the inner wall of the hollow body by the cleaning device. This increases the service life of the coating device, i.e. the time in which the coating device can be used, but also the stability and quality of the coating during the period of use. Furthermore, in embodiments, a direct insight into the evolution of the coating process as well as into the operation of components of the coating device, such as the cleaning device, is possible.

With the aid of the coating arrangement, particles of different materials can be coated, for example metals, alloys, ceramics, glass, plastics, carbon or carbon compounds and many more. The particle size and shape is also hardly limited; in particular, particles with a size in the range of less than 0.5 micrometers can also be coated.

In embodiments, the coating device comprises a plurality of coating sources, i.e. at least two, wherein the different coating sources may differ in the coating material and/or type of particle source or configuration (point or line source, rigid or movable). The different coating sources are arranged such that they emit their coating material in each case with respect to different partial regions of the particle track, i.e. into different coating regions, wherein the different coating regions can be spatially delimited from one another or can also partially overlap. In this case, the different coating regions can be arranged with respect to the circumference of the hollow body in a cross section transverse to the axis of the hollow body and/or with respect to the extent of the hollow body along the axis of the hollow body.

With this embodiment, in the case of coating sources with the same coating material, the thickness of the coating can be increased even in the case of a short length of the particle track which covers the circumference of the inner wall of the hollow body at most once, since the particles to be coated move through a plurality of coating regions. With coating sources with different coating materials, layer sequences, so-called multilayer, can be deposited on the particles. In both cases, when using corresponding parameters of the coating source, such as, for example, temperature, density, emission rate, etc., layers with a gradient of the composition or other properties, such as density, electrical conductivity or other properties, can also be produced.

In embodiments, one or more partition walls are arranged in the interior of the hollow body. These partition walls extend to almost the inner wall of the hollow body and divide the interior of the hollow body into a plurality of coating regions when they are arranged, for example, between different coating sources, or into one or more coating regions and a non-coating region, as has already been described above. The partition walls serve to limit the propagation of the coating material emitted by a coating source. Furthermore, these partition walls can also enable a delimitation of different pressure ranges from one another.

Furthermore, it is possible for further partition walls to be arranged in the interior of the hollow body, for example in the non-coating region, which separate different pressure regions or different working regions from one another, such as, for example, a region with the particle sink and a region with the cleaning device.

Thus, cross contaminations between individual coating regions or between the coating region or regions and the non-coating region or between different working regions within the non-coating region can be reduced or avoided.

In embodiments, the axis of the hollow body extends horizontally. This includes a deviation of ±10° from the horizontal. In other embodiments, the axis of the hollow body assumes a different spatial angle of inclination. This angle of inclination can be, for example, 30° or −30° with respect to the horizontal.

In embodiments, the hollow body has a circular shape in a cross section transverse to the axis. In this case, the rotation of the hollow body is particularly easy to realize.

In embodiments, the cross section of the hollow body transversely to the axis varies over the length of the hollow body along the axis in its shape and/or size. This change can take place continuously or stepwise as long as the above mentioned conditions for the particle track are met. For example, the hollow body can be open only on one side, wherein it can be a cylinder open on one side or a hemisphere or a cup or the like. However, the hollow body can also be open on both sides, wherein one opening can be larger than the other.

In embodiments, the hollow body has an edge region on one or both of its ends of its cross section along the axis, which edge region extends from a peripheral region of the hollow body in the direction of the axis, but without reaching the latter. This edge region can extend from the peripheral region of the hollow body at an angle greater than 0 (zero) and less than or equal to 170°, for example less than or equal to 90°, with respect to the peripheral region in the direction of the axis. This edge region thus forms a raised edge of the hollow body, which reduces the opening of the hollow body on the corresponding side on which it is arranged. The edge region itself can be straight or curved and can merge, in a rounded, i.e. curved manner, or with a corner into the peripheral region of the hollow body.

In specific embodiments, at least a part of the edge region is electrically insulated from other parts of the hollow body. The part of the edge region which is electrically insulated from the other parts of the hollow body can extend over the entire circumference of the edge region in cross section transversely to the axis or can also be present only in certain portions of the circumference. Furthermore, the part of the edge region which is electrically insulated from the other parts of the hollow body can extend over the entire width of the edge region in cross section along the axis, i.e. over the entire material width, or can also be present only in certain portions of the width. Furthermore, the part of the edge region which is electrically insulated from the other parts of the hollow body can extend over the entire length of the edge region or can also be present only in certain sections of the length, wherein the length describes the extension of the edge region away from the outer side of the peripheral region of the hollow body. The parts of the hollow body that are electrically insulated from one another, such as for example the edge region and the peripheral region, can be subjected to different potentials during operation of the coating arrangement.

In embodiments, the coating device further includes a particle acceleration device. This is arranged in the interior of the hollow body in a stationary manner with respect to the hollow body and is adapted for accelerating the particles in the interior of the hollow body on their particle track relative to the path velocity of the hollow body. This is advantageous, for example, when the movement impulse which the particles receive when exiting the particle source is very small or if the particles have already lost a part of their movement impulse on their particle track. The particle acceleration device is preferably arranged in the non-coating region of the coating device.

Furthermore, the coating device can also contain a plurality of the above-described components, such as, for example, a plurality of particle sources or a plurality of particle sinks, wherein these can be arranged offset to one another along the circumference of the hollow body and/or along the axis of the hollow body.

The coating arrangement can contain further components. For example, it can contain one or more temperature control devices which are adapted for heating or cooling the coating chamber and/or the hollow body and/or the coating source and/or further components at least in regions to a predetermined temperature. The temperature of the coating material and/or of the gas space in the hollow body, and thus of the particles, and/or of the hollow body, can influence the quantity and quality of the particle coating.

Furthermore, the coating arrangement can have one or more voltage or current sources, which are adapted for applying a defined potential to individual components of the coating arrangement at least in regions, such as, for example, the hollow body. Furthermore, the coating arrangement can have a particle return device which is adapted for recirculating back into the particle source those particles, which, when entering the coating region, do not have the required speed or the desired coating thickness when entering the particle sink.

Furthermore, the coating arrangement can also contain a plurality of the coating devices described above.

A further aspect of the invention relates to a method for coating particles using the coating arrangement according to the invention. The method according to the invention thus initially comprises a step of providing the above-described coating arrangement, the coating device of which has a hollow body, a particle source, a coating source and a cleaning device. Furthermore, the method comprises the following steps: a step of introducing particles from the particle source into the hollow body of the coating device and of guiding the particles on the particle track, a step of emitting the coating material from the coating source of the coating device, a step of rotating the hollow body about its axis and a step of removing adhering coating material from the inner wall of the hollow body by means of the cleaning device. The steps apart from the step of providing the coating arrangement are carried out simultaneously during operation of the coating arrangement, i.e. when carrying out the method. In the method, the particles to be coated are thus introduced from the particle source onto a particle track, which is formed by at least a part of the inner wall of the hollow body and are guided thereon through a coating region of the coating device. In this case, the particles move on their particle track at a greater speed than the path velocity of the inner wall of the hollow body, resulting from the rotation of the hollow body about its axis. At the same time, in another region of the rotating hollow body, in the non-coating region, the parasitic coating, i.e. the coating material adhering to the inner wall of the hollow body, is removed from the inner wall of the hollow body.

The method according to the invention improves the coating of the particles with respect to thickness, quality and homogeneity, and secondly it increases the service life of the coating device and the long-term stability of the coating process.

In embodiments, the coating source emits the coating material substantially perpendicularly to the axis of the hollow body into the coating region, so that the particles cross the region of highest coating rate on their particle track.

In embodiments, the particles are guided on their particle track substantially around the axis of the hollow body and substantially not along the axis of the hollow body.

In embodiments, several coating sources are arranged within the hollow body and the particles are coated with several layers of a coating material or different coating materials during their movement on the particle track.

Regarding further embodiments of the method, reference is made to the description of the coating arrangement according to the invention, wherein the corresponding components of the coating arrangement are used.

A further aspect of the invention relates to the use of the coating arrangement according to the invention and/or the method according to the invention for coating particles in powder metallurgy, in 3D prototyping, in the chemical, semiconductor, paint, cosmetic and textile industry, in medicine or also in fuel or battery cell technology.

The invention is not limited to the illustrated and described embodiments but also includes all embodiments which act identically within the meaning of the invention. Furthermore, the invention is also not limited to the especially described feature combinations but can also be defined by any other combination of particular features of all individual features disclosed overall, provided that the individual features are not mutually exclusive, or a specific combination of individual features is not explicitly excluded.

The invention is explained in more detail below with reference to a number of exemplary embodiments and drawings. The exemplary embodiments serve to better understand the invention without limiting it.

Figure 2:
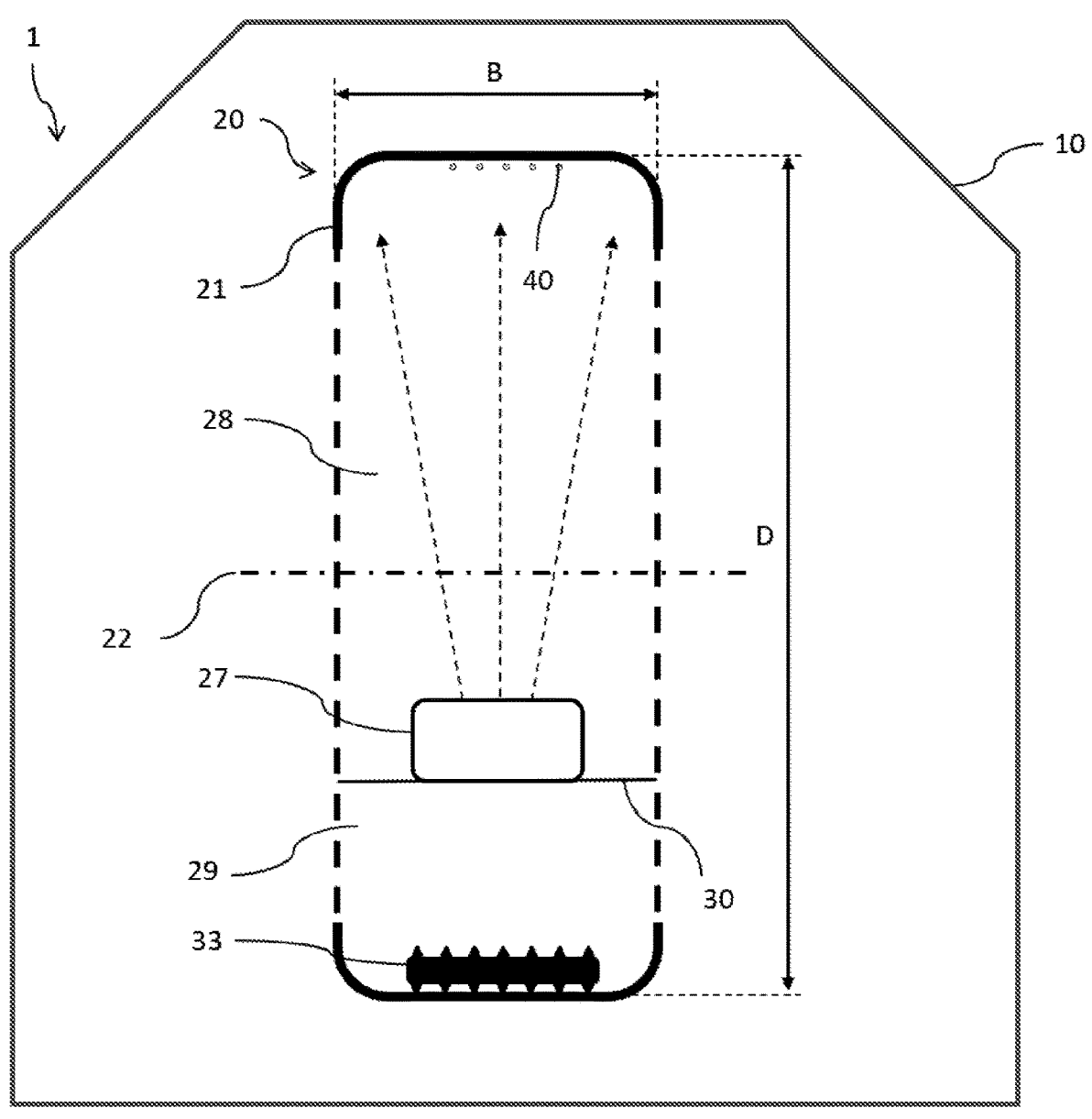
FIG. 2 shows a schematic representation of the coating arrangement in cross section along the axis of the hollow body

FIGS. 1 and 2 show a schematic representation of a coating arrangement 1 which contains a coating chamber 10 and a coating device 20. The coating device 20 comprises, inter alia, a hollow body 21 with a virtual axis 22, wherein the coating arrangement 1 is shown in FIG. 1 in cross section transversely to the axis 22 and in FIG. 2 in cross section along axis 22 and along line A-A shown in FIG. 1. The coating device 20 is arranged within the coating chamber 10. The coating chamber 10 is a closed, but openable chamber and is connected to a pumping system 11 and a gas supply system 12, so that an atmosphere with a defined composition and pressure can be produced inside the coating chamber 10. The defined atmosphere can differ at different points in time. For example, during a coating process, it can contain a reaction gas which is involved in the formation of the coating, for example of ceramic layers, on the particles to be coated, while it can contain a purge gas, for example, before the coating chamber 10 is opened and it is composed of air during the opening of the coating chamber 10. The coating chamber 10 can assume any desired shape as long as it is suitable for receiving the coating device 20. It can, for example, have the same outer shape as the hollow body 21 or can consist of two hollow bodies connected to one another at the ends, in the intermediate space of which the coating device 20 is arranged.

The hollow body 21 is shown schematically in all figures as a circular cylinder, which has a circular shape in cross section transverse to the axis, i.e. in an x-y plane of a Cartesian x-y-z coordinate system. However, the hollow body can also be designed differently. The z-axis corresponds to the axis 22 of the hollow body 21 and can extend, for example, in the horizontal direction.

The hollow body 21 has an inner wall 23 which, at least in regions, forms a particle track 24 on which particles 40 move within the hollow body 21. The particles are introduced by means of a particle source 25 into the hollow body 21 and onto the particle track 24 at a particle inlet point 251, then move on the particle track 24 into the particle movement direction 41 along the inner wall 23 of the hollow body 21 up to a particle outlet point 261, at which they are removed again from the interior of the hollow body 21 by means of a particle sink 26. For this purpose, the particle sink 26 can also contain a particle-receiving support unit 2612, which is adapted for braking the particles 40 and/or release them from the inner wall 23 of the hollow body 21, such as a brush. Of course, stepped brush arrangements, possibly in combination with particle guide plates, which can also be vibration-assisted, are also possible. In the illustration, the particle source 25 and the particle sink 26 are shown in one and the same x-y plane, and the particle track 24 describes only one segment, here of approximately 320°, of the inner wall 23 of the hollow body 21. However, this can also be designed differently; for example, the particle track 24 can also describe smaller segments of the inner wall 23 of the hollow body 21 or the particle track 24 can also describe one or more complete circles, i.e. it can completely contain the circumference of the inner wall 23 of the hollow body one or more times, and optionally contain further segments of the inner wall 23 and, for example, have a spiral shape. The particle source 25 and the particle sink 26 can also be arranged in different x-y planes. The particle source 25 and the particle sink 26 can thus be arranged at any positions of the hollow body 21, for example also outside the hollow body 21, as long as they are able to introduce the particles 40 into the hollow body 21 or to guide the particles 40 out of the hollow body 21. Furthermore, it is possible to connect the particle sink 26 to the particle source 25, so that already coated particles 40 are reinserted and coated in the hollow body 21.

In addition to the components already mentioned, the coating device 20 comprises a coating source 27, which is adapted for emitting coating material 42 into the hollow body 21 in a direction perpendicular to the axis 22. The emitted coating material 42 is shown for different emission directions in FIGS. 1 and 2 by the broken arrows. As can be seen, the emission direction in the x-y plane can cover a wide region of the circumference of the inner wall 23 of the hollow body 21 and, in this case, also extend radially to the axis 22, while it only slightly deviates from the perpendicular to the axis, e. g. by ±10°, as can be seen in FIG. 2. The specific emission direction of the coating source 27 is of course dependent on the type of coating source 27 and its arrangement within the hollow body 21. Thus, the coating source 27 and in particular the surface of the coating source 27 from which the coating material 42 is emitted can be arranged centrally but below the axis 22, as shown in FIGS. 1 and 2. However, other positions of the coating source 27 within the hollow body 21 are also possible, on the (virtual) axis 22, above and/or on the side of axis 22. The coating material 42 is emitted into a coating region 28 of the coating device 20, wherein the coating region 28 can be separated from a non-coating region 29 of the coating device 20 by a partition wall 30, as shown in the figures. The partition wall 30 prevents the spreading of the coating material 42 into the non-coating region 29, so that the particles 40 are coated with the coating material 42 substantially only in the coating region 28. The partition wall 30 can be arranged as desired within the hollow body 21 and can have any shape: it can run straight or curved or bent. Furthermore, the partition wall 30 can also be arranged in different planes perpendicular to axis 22 at different positions and/or have different shapes. The coating source 27 can also be arranged partially in the non-coating region 29 as long as it is adapted for emitting coating material 42 into the coating region 28. For example, only the emission surface of the coating source 27 can be arranged in the coating region 28.

Furthermore, a plurality of coating sources can of course also be arranged in the hollow body 21, wherein these can be arranged offset to one another in the x-y plane, i.e. with respect to the circumference of the hollow body 21, or in the y-z plane, i.e. along the axis 22 of the hollow body 21. Coating devices with a plurality of coating sources are described by way of example with reference to FIGS. 4 and 5.

As a result, particles 40 are coated with coating material 42 in the coating region 28, which is illustrated in FIG. 1 in that the particles 40 are shown as white circles when entering the particle track 24, while the black circles symbolize the coated particles. Of course, the transition is flowing, since, depending on the coating source, the particles 40 are coated throughout the coating region 28.

The coating device 20 furthermore has a rotation device 31, which is adapted for rotating the hollow body 21 about the axis 22 in a direction of rotation 32. By way of example, two rollers are shown here as rotation device 31, which rollers act on the outer circumference of hollow body 21 and rotate both clockwise and thus cause the hollow body 21 to rotate counterclockwise. At least one of the rollers is actively rotated by a moving device (not shown), while the other of the rollers can also only run passively and serves as an additional bearing. In the case shown, the particle movement direction 41 corresponds to the direction of rotation 32 of the hollow body 21. However, the direction of rotation 32 can also be opposite to the particle movement direction 41. Of course, other embodiments of the rotation device 31 are also possible and known to the person skilled in the art. Furthermore, the coating device includes a particle acceleration device 39 arranged in the interior of the hollow body 21 and adapted for accelerating the particles 40 in the interior of the hollow body 21 on their particle track relative to the path velocity of the hollow body 21.

The coating device 20 further comprises a cleaning device 33, which is arranged in the interior of the hollow body 21 and in a stationary manner with respect to the hollow body 21. The cleaning device 33 interacts with a region of the inner wall 23 of the hollow body 21 and is adapted for removing adhering coating material from the inner wall 23 in this region. In the example shown, the cleaning device 33 is designed as a series of three brushes arranged one behind the other along the inner circumference of the hollow body. Of course, the cleaning device can also contain more or less brushes and/or other cleaning devices known from the prior art. The cleaning device 33 is arranged—exactly like the particle source 25 and the particle sink 26—in the non-coating region 29, namely in a region that is not part of the particle track 24. Thus, the cleaning device 33 is arranged in a region between the particle sink 26 and the particle source 25, in which no particles 40 are present. In case of other cleaning devices, for example a laser unit, these devices can also be coupled to the interior of the hollow body via a window, wherein the window can be located in a further hollow body. The cleaning device can contain a depression, which collects the coating material removed from the inner wall 23 of the hollow cylinder 21 and which, if necessary, feeds the material out of the interior of the hollow cylinder 21 or feeds it back to the coating source.

The dimensions of the hollow body 21 are denoted in FIG. 2. In this case, the hollow body 21 has a width B, which is measured along the axis 22 and a diameter D which is measured perpendicular to the axis 22. The ratio of D to B can be less than 1, equal to 1 or greater than 1. Ratios D/B<<1 or D/B>>1 are also possible. The diameter D can be, for example, in the range from 0.3 m to 7 m, for example in the range from 0.7 m to 2 m. The width B can be, for example, in the range from 0.1 m to 4 m, for example in the range from 0.4 m to 1 m.

Furthermore, it can be seen in FIG. 2 that the hollow body 21 has, at its two ends, in each case in relation to the z-direction, a respective edge region, which extends in the direction of the axis 22, so that the hollow body 21 has different sizes, i.e., diameters, at different positions along the z-axis. The above mentioned diameter D is the maximum diameter of the hollow body 21. Various embodiments of the edge region are explained in more detail with reference to FIGS. 6A to 6C. Although in FIG. 2 particles 40 are shown only in the central region of the hollow body 21 with respect to its extension along the axis 22, particle tracks can also extend into the edge region of the hollow body 21.

The cleaning device 33 shown in FIG. 2 can also extend into the edge regions of the hollow body 21 and remove coating material adhering to these regions.

Figure 3:
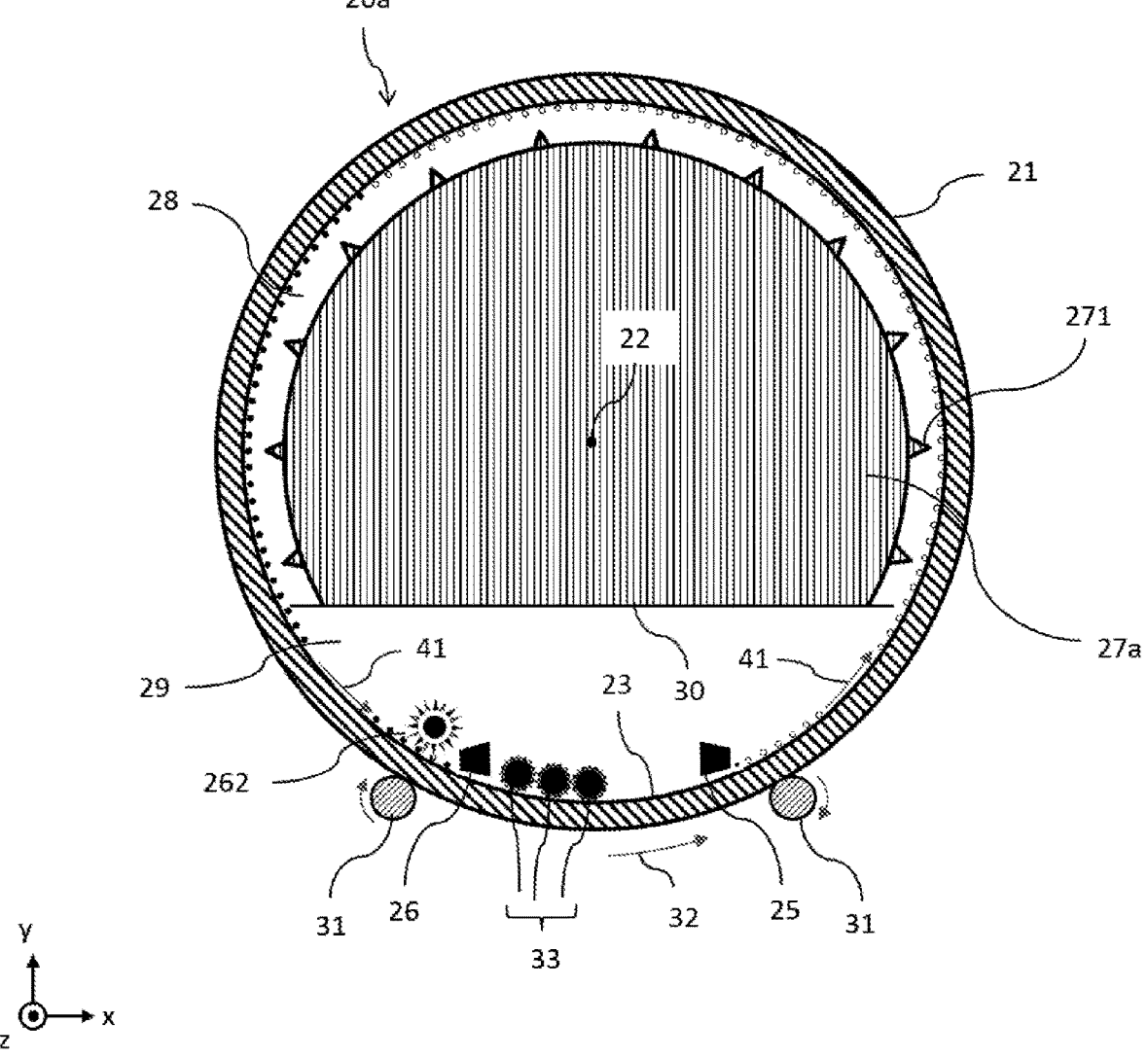
FIG. 3 shows a first embodiment of the coating device in cross section transversely to the axis of the hollow body.
Figure 4:
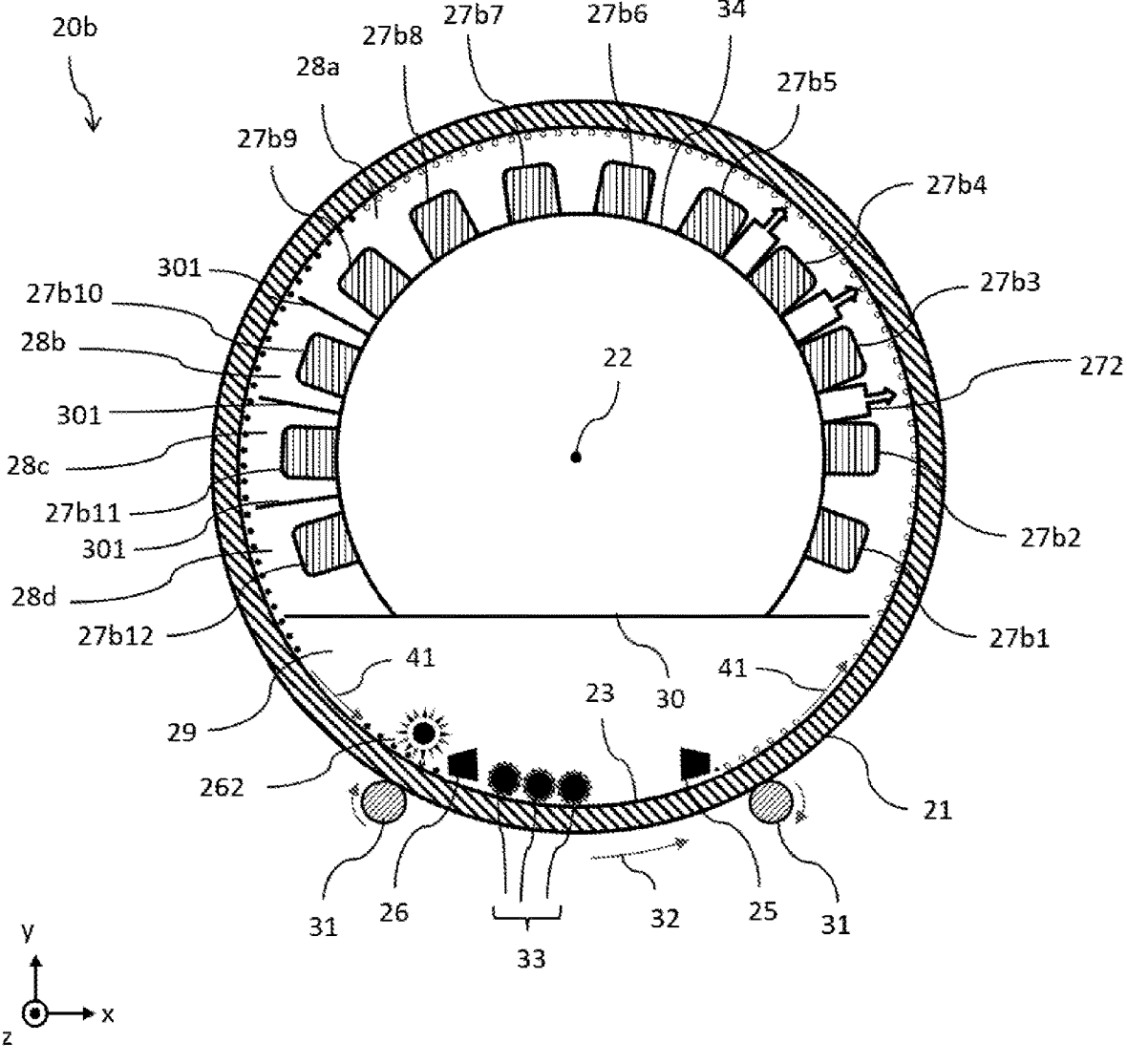
FIG. 4 shows a second embodiment of the coating device in cross section transversely to the axis of the hollow body.
Figure 5:
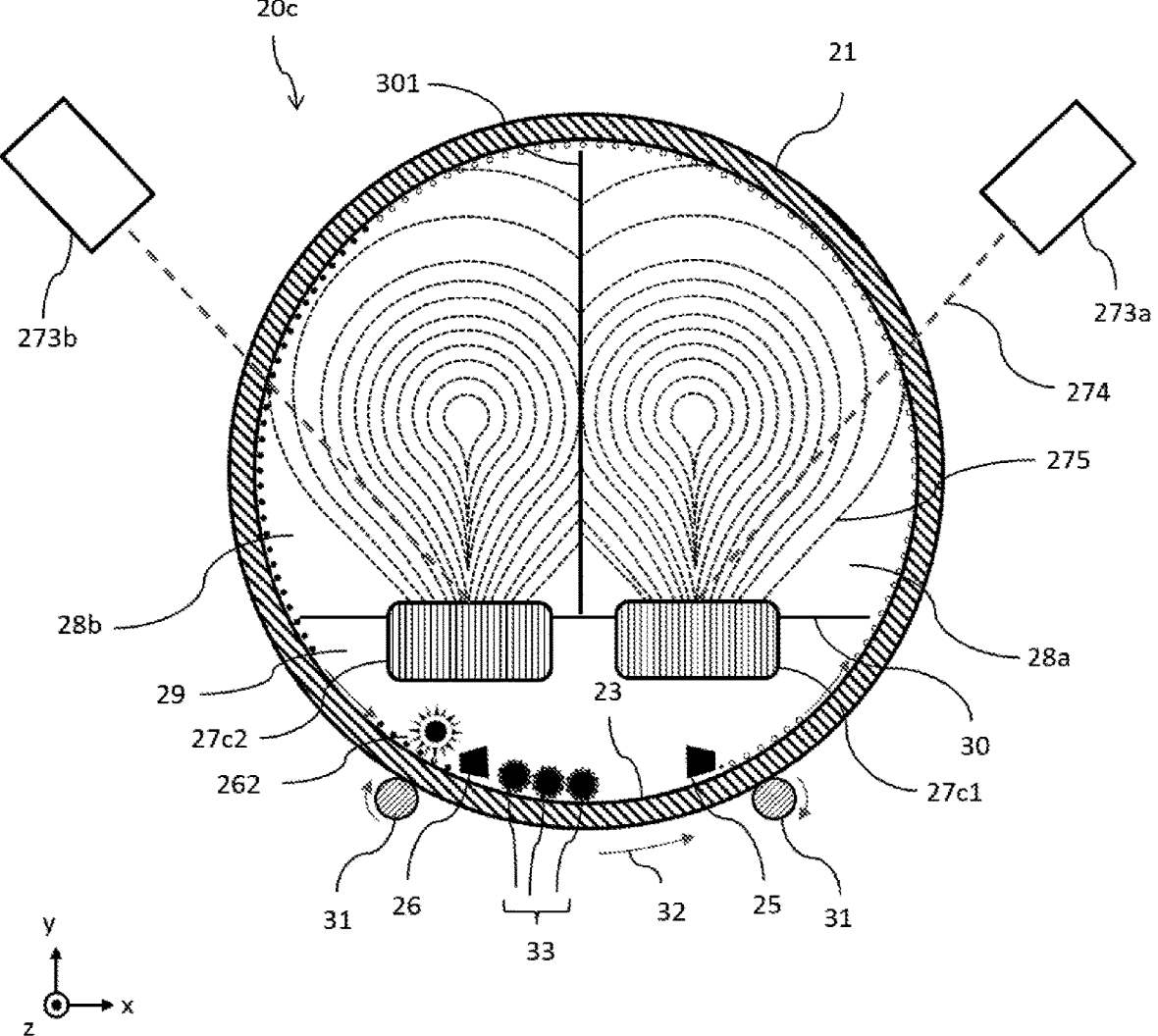
FIG. 5 shows a third embodiment of the coating device in cross section transversely to the axis of the hollow body.

With reference to FIGS. 3 to 5, various embodiments of the coating device 20 and in particular of the coating source 27 are explained below.

FIG. 3 shows a first embodiment 20a of the coating device having a coating source 27a. The coating source 27a can, for example, be an evaporation unit, which provides the coating material in vapor form and delivers it into the coating region 28 via outlet nozzles 271. The outlet nozzles 271 are arranged radially on an outer side of the coating source 27a and are distributed uniformly over the entire peripheral length of the coating source 27a in the coating region 28. Of course, the outlet nozzles 271 can also be distributed unevenly or the coating source 27a can emit different coating materials via different outlet nozzles, which materials are provided separately from one another in vapor form in the coating source 27a.

FIG. 4 shows a second embodiment 20b of the coating device with a plurality of coating sources 27b1 to 27b12. The coating sources 27b1 to 27b12 can be, for example, sputtering compartments, which are arranged radially on the outer side of a cylindrical support 34 so as to be offset relative to one another with respect to the circumference of the hollow body 21 in such a way that they each emit coating material radially in the direction of the inner wall 23 of the hollow body 21. Optionally, a potential can be applied to the hollow body in order to selectively attract ions or electrons to the inner wall 23 of the hollow body 21 or to repel them from it. The coating region is divided by partition walls 301 in four coating regions 28a to 28d that are substantially separate from one another. In the various coating regions 28a to 28d, the particles passing the respective region on their particle path can be coated with different coating materials. Reactive layer depositions are also possible. For this purpose, for example, gas inlets 272 are respectively arranged between the coating sources 27b2 to 27b5, which gas inlets introduce a reaction gas into the coating region 28a, in particular into the region between the coating sources 27b2 to 27b5, so that metal oxides, metal nitrides or metal carbides can be deposited in this region, for example. Since no additional partition walls 301 are present in the coating region 28a, the gas admitted via the gas inlets 272 is distributed with decreasing concentration also to a certain extent in the coating region 28a if it was not completely converted during the reaction. In this way or with different gas flows at the different gas inlets, graded layers, i.e. layers with a composition provided with a gradient, can also be deposited.

FIG. 5 shows a third embodiment 20c of the coating device with two coating sources 27c1 and 27c2, which are arranged in two coating regions 28a and 28b separated from one another by a partition wall 301. Both coating sources 27c1 and 27c2 are designed as electron beam evaporators. To this end, the coating device 20c has two laterally coupling electron beam sources 273a, 273b, which each emit an electron beam 274. This beam impinges on the coating source 27c1 or 27c2 and evaporates or sublimes the material located therein, which can differ from one another. The evaporated, sublimated or semi-sublimated material, i.e. the coating material, propagates into a distribution 275 in the respective coating region 28a or 28b. Thus, for example, binary layer systems can be formed, in which the layers are formed discretely on the particles 40. Depending on the design of the partition wall 301, for example its extension from the partition wall 30 in the direction of the inner wall 23 of the hollow body 21, mixed layers or coatings with a flowing transition between the two coating materials can also be produced in the form of so-called gradient layers.

When using an electron beam evaporator, the backscattering of electrons occurs, which can interact with the evaporated coating material and/or the particles. In order to be able to influence this interaction in a targeted manner, the coating arrangement 20c can furthermore have one or more devices, which deflect or attract the backscattered electrons in a targeted manner, continuously or discontinuously, for example positively charged sacrificial anodes.

Figure 6A:
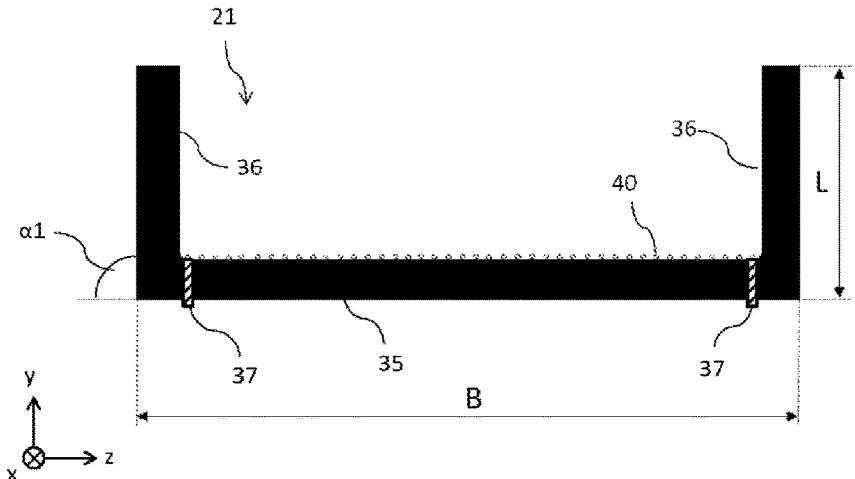
FIG. 6A to 6C show schematic representations of various embodiments of the profile of the hollow body in cross section along the axis of the hollow body.
Figure 6B:
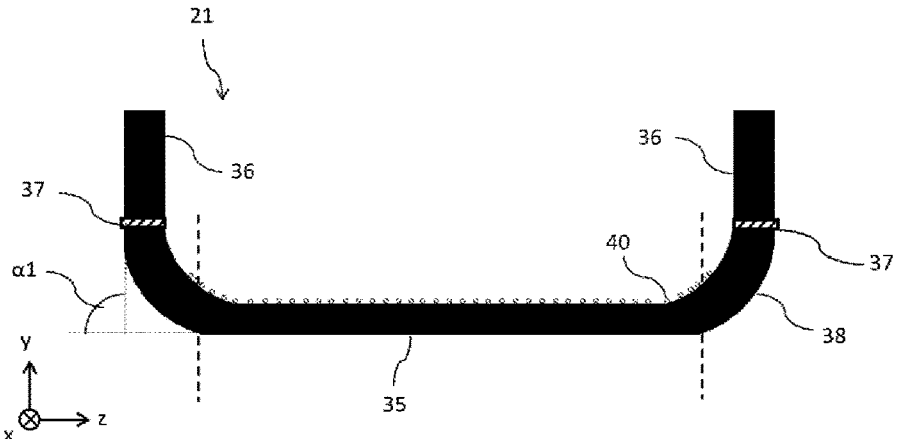
Figure 6C:
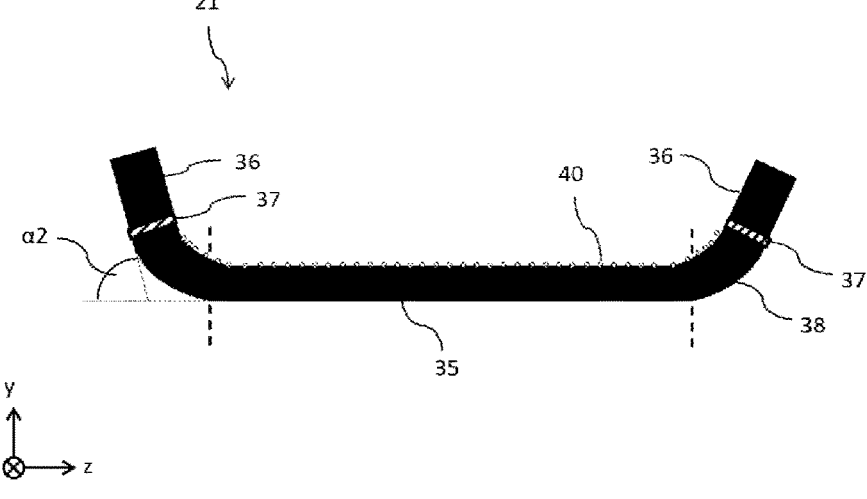

FIGS. 6A to 6C again illustrate special embodiments of the profile of the hollow body 21 over its extension along the axis of the hollow body 21, as was already briefly indicated with reference to FIG. 2. Furthermore, different embodiments of an electrical insulation are shown in FIGS. 6A to 6C. FIG. 6B corresponds to the profile of FIG. 2, wherein no electrical insulation is provided in FIG. 2.

FIG. 6A shows an angled profile, with which a straight edge region 36 of the hollow body 21 extends at an angle α1=90° from a peripheral region 35 of the hollow body 21 in the direction of the axis of the hollow body 21 (not shown here) on each side of the hollow body 21 and with which the transition between the edge region 36 and the peripheral region 35 is configured to be angled. In the example shown, both the outer side of the hollow body 21 and the inner wall of the hollow body 21 have a corner on each side between the peripheral region 35 and the edge region 36, but, for example, the inner wall can also be curved. The particles 40 to be coated thereby move primarily on the inner wall of the peripheral region 35. The peripheral region 35 is the region of the hollow body 21 with the largest diameter D (see FIG. 2).

Furthermore, an electrical insulation 37, for example an electrically insulating material, is arranged between the two edge regions 36 and the peripheral region 35, which allows the edge regions 36 and the peripheral region 35 to be subjected to a different potential. This can also contribute to the definition of the region in which the particles 40 to be coated are moving. The electrical insulation 37 can be arranged in the respective edge region 36 or in the peripheral region 35 or at the transition between the respective edge region 36 and the peripheral region 35.

The edge regions 36 can extend with a length L in the direction of the axis of the hollow body 21, wherein the length L is measured perpendicular to the axis of the hollow body 21 and starting from the outer side of the peripheral region 35. The ratio of the width B of the hollow body 21 to the length L of the edge region 36 can be less than 1, equal to 1 or greater than 1, wherein the length L is limited to a value less than half the diameter D of the hollow body 21 and is preferably less than a quarter of the diameter D (see FIG. 2).

FIG. 6B shows another profile of the hollow body 21, with which a transition region 38 is arranged between the edge regions 36 and the peripheral region 35. The edge regions 36 themselves are again straight and extend, as in FIG. 6A, at an angle $\alpha 1=90°$ from the peripheral region 35 in the direction of the axis of the hollow body 21. The transition regions 38, the boundary of which to the peripheral region 35 is represented by the dashed lines, extend in a curved manner both on the outer side of the hollow cylinder 21 and on the inner wall of the hollow cylinder 21 and thus enables a smooth transition between the edge regions 36 and the peripheral region 35. As can be seen, the particles 40 partially also move on the inner wall of the transition region 38. This can also be assisted by the electrical insulation 37, which is pushed further outwards, which is located here at the transition between the respective transition region 38 and the respective edge region 36.

FIG. 6C shows a further profile of the hollow body 21, which is similar to that shown in FIG. 6B, with which, however, the edge regions 36 extend at an angle $\alpha 2$ of approximately 75° measured with respect to the peripheral region of the hollow body.

Of course, in each of the shown embodiments of the profile, only one edge region 36 can also be formed on one side of the hollow body 21 with respect to the z-direction or the two edge regions 36 can be designed differently with respect to their length L, their angle $\alpha$ or their transition to the peripheral region 35.

REFERENCE SIGNS

1 Coating arrangement
10 Coating chamber
11 Pumping system
12 Gas supply system
20, 20a-20c Coating device
21 Hollow body
22 Axis of the hollow body
23 Inner wall of the hollow body
24 Particle track
25 Particle source
251 Particle inlet point
26 Particle sink
261 Particle outlet point
262 Particle receiving support unit
27, 27a, 27b1-27b12, 27c1, Coating source
27c2
271 Outlet nozzle
272 Gas inlet
273a, 273b Electron beam source
274 Electron beam
275 Distribution of coating material

28, 28a-228d Coating region
29 Non-coating region
30-301 Partition wall
31 Rotation device
32 Direction of rotation of the hollow body
33 Cleaning device
34 Support
Peripheral region
36 Edge region
37 Electrical insulation
38 Transition region
39 Particle acceleration device
Particle
41 Particle movement direction
42 Coating material
B Width of the hollow body
D Diameter of the hollow body
L Length of the edge region
$\alpha 1$, $\alpha 2$ Angle of the edge region with respect to the circumference of the hollow body

The invention claimed is:

1. A coating arrangement for coating particles having a coating chamber and
a coating device arranged within the coating chamber comprising:
    a hollow body having an axis, wherein the inner wall of the hollow body forms a smooth particle track about the axis of the hollow body between a particle inlet point and a particle outlet point,
    a particle source adapted for introducing the particles into the hollow body at the particle inlet point, so that the particles move on the particle track,
    a particle sink adapted for receiving the particles at the particle outlet point after them passing through the particle track and for extracting them from the hollow body,
    at least one coating source, wherein each coating source is arranged within the hollow body and is adapted for emitting a coating material along a direction perpendicular to the axis of the hollow body in such a way that the coating material comes into contact with the inner wall of the hollow body in a coating region, which contains at least part of the particle track,
    a rotation device adapted for rotating the hollow body about its axis, and
    a cleaning device, which is arranged in the interior of the hollow body in a stationary manner with respect to the hollow body and is adapted for removing adhering coating material from the inner wall of the hollow body in a non-coating region of the hollow body outside the particle track,
wherein:
    the shape and/or size of the cross section of the hollow body transversely to axis changes over the length of the hollow body along the axis;
    the hollow body has an edge region on one or both of its ends of its cross section along the axis, said edge region extending from a peripheral region of the hollow body in the direction of the axis, but without reaching the latter; and
    the hollow body has a smooth profile in a cross section along its axis, wherein the edge region of the hollow body is formed in a straight manner and extends at an angle $\alpha 2$ of about 75° from the peripheral region of the hollow body in the direction of the axis of the hollow body on each side of the hollow body and wherein a transition region is arranged between each of the edge regions, the transition regions extending in a curved manner.

2. The coating arrangement according to claim 1, characterized in that a plurality of coating sources are arranged inside the hollow body.

3. The coating arrangement according to claim 1, characterized in that one or more partition walls are arranged in the interior of the hollow body, wherein the partition walls extend almost to the inner wall of the hollow body and divide the interior of the hollow body into a plurality of coating regions or into one or more coating regions and the non-coating region.

4. The coating arrangement according to claim 1, characterized in that the axis of the hollow body extends horizontally.

5. The coating arrangement according to claim 1, characterized in that the hollow body has a circular shape in a cross section transverse to axis.

6. The coating arrangement according to claim 1, characterized in that at least a part of the edge region is electrically insulated from other parts of the hollow body.

7. The coating arrangement according to claim 1, characterized in that the hollow body is at least partially formed by an endless belt.

8. The coating arrangement according to claim 1, characterized in that the coating device further contains a particle acceleration device, which is arranged in the interior of the hollow body in a stationary manner with respect to the hollow body and is adapted for accelerating particles in the interior of the hollow body on their particle track relative to the path speed of the hollow body.

9. A method for coating particles with the coating arrangement according to claim 1, comprising:

providing a coating arrangement according to claim 1, introducing particles from the particle source into the hollow body of the coating device and guiding the particles on the particle track, simultaneously emitting the coating material from the coating source of the coating device such that the coating material comes into contact with the inner wall of the hollow body in the coating region, simultaneously rotating the hollow body about its axis and simultaneously removing adhering coating material from the inner wall of the hollow body by the cleaning device in the non-coating region of the hollow body.

10. The method according to claim 9, characterized in that the coating material is emitted substantially perpendicularly to the axis of the hollow body.

11. The method according to claim 9, characterized in that the particles are guided on the particle track substantially around the axis of the hollow body and substantially not along its axis.

12. The method according to claim 9, characterized in that a plurality of coating sources are arranged within the hollow body and the particles are coated with a plurality of layers of a coating material or different coating materials during their movement on the particle track.

13. The coating arrangement according to claim 1, characterized in that the particle sink is arranged in the non-coating region.

14. The coating arrangement according to claim 1, characterized in that the cleaning device is arranged over the whole extension of the hollow body along its axis.

15. The coating arrangement according to claim 1, characterized in that the cleaning device contains a depression, which is adapted for collecting the coating material removed from the inner wall of the hollow body by the cleaning device.

16. The coating arrangement according to claim 1, wherein the angle $\alpha 2 = 75°$.

\*   \*   \*   \*   \*